(12) United States Patent
Hu et al.

(10) Patent No.: US 9,599,665 B2
(45) Date of Patent: Mar. 21, 2017

(54) LOW OVERDRIVE PROBES WITH HIGH OVERDRIVE SUBSTRATE

(71) Applicant: Advantest Corporation, Tokyo (JP)

(72) Inventors: Ting Hu, Arcadia, CA (US);
Lakshmikanth Namburi, Arcadia, CA (US)

(73) Assignee: ADVANTEST CORPORATION, Tokyo (JP)

( * ) Notice: Subject to any disclaimer, the term of this patent is extended or adjusted under 35 U.S.C. 154(b) by 975 days.

(21) Appl. No.: 13/899,458

(22) Filed: May 21, 2013

(65) Prior Publication Data
US 2014/0347084 A1    Nov. 27, 2014

(51) Int. Cl.
*G01R 31/20* (2006.01)
*G01R 31/28* (2006.01)

(52) U.S. Cl.
CPC .............................. *G01R 31/2891* (2013.01)

(58) Field of Classification Search
CPC ............ G01R 31/2891; G01R 1/06727; G01R 31/2601; G01R 31/2829; G01N 21/253; H01L 2924/00014; H01L 21/76879
USPC ...... 324/754.1, 500, 754.03, 754.01, 754.13, 324/754.14, 756.03, 756.04, 757.04, 324/757.05, 754.2
See application file for complete search history.

(56) References Cited

U.S. PATENT DOCUMENTS

| | | | | |
|---|---|---|---|---|
| 2007/0145988 A1* | 6/2007 | Garabedian | ........ | G01R 1/07378 324/750.22 |
| 2007/0268035 A1* | 11/2007 | Yamaguchi | ........ | G01R 1/07314 324/756.03 |
| 2011/0285417 A1* | 11/2011 | Kimoto | ............. | G01R 1/06727 324/755.07 |
| 2013/0285688 A1* | 10/2013 | Namburi | ............ | G01R 31/2887 324/750.25 |

* cited by examiner

*Primary Examiner* — Melissa Koval
*Assistant Examiner* — Trung Nguyen

(57) ABSTRACT

A method for testing a semiconductor device is disclosed. The method comprises positioning a probe card comprising a plurality of probes above the semiconductor device and moving the probe card in a vertical direction towards the semiconductor device. The plurality of probes are moving in a vertical direction towards a plurality of electrical structures of the semiconductor device until each probe of the plurality of probes has made mechanical contact with a corresponding electrical structure of the plurality of electrical structures with a minimum quantity of force. The each probe of the plurality of probes absorbs a portion of vertical overdrive after contacting their corresponding electrical structures. The probe card absorbs any remaining vertical overdrive. The vertical overdrive is a continuing vertical movement of the plurality of probes after a first probe of the plurality of probes mechanically contacts a first corresponding electrical structure.

20 Claims, 13 Drawing Sheets

Rigid probe, non-compliant probe card system

MEMS probe, non-compliant probe card system

Rigid probe with compliant probe card system

MEMS probe with compliant probe card system

Pad wafer damaged

Compliance absorbed by penetrating into solder bumps

Compliance absorbed by MEMS probe deformation

Compliance absorbed by MEMS probe deformation

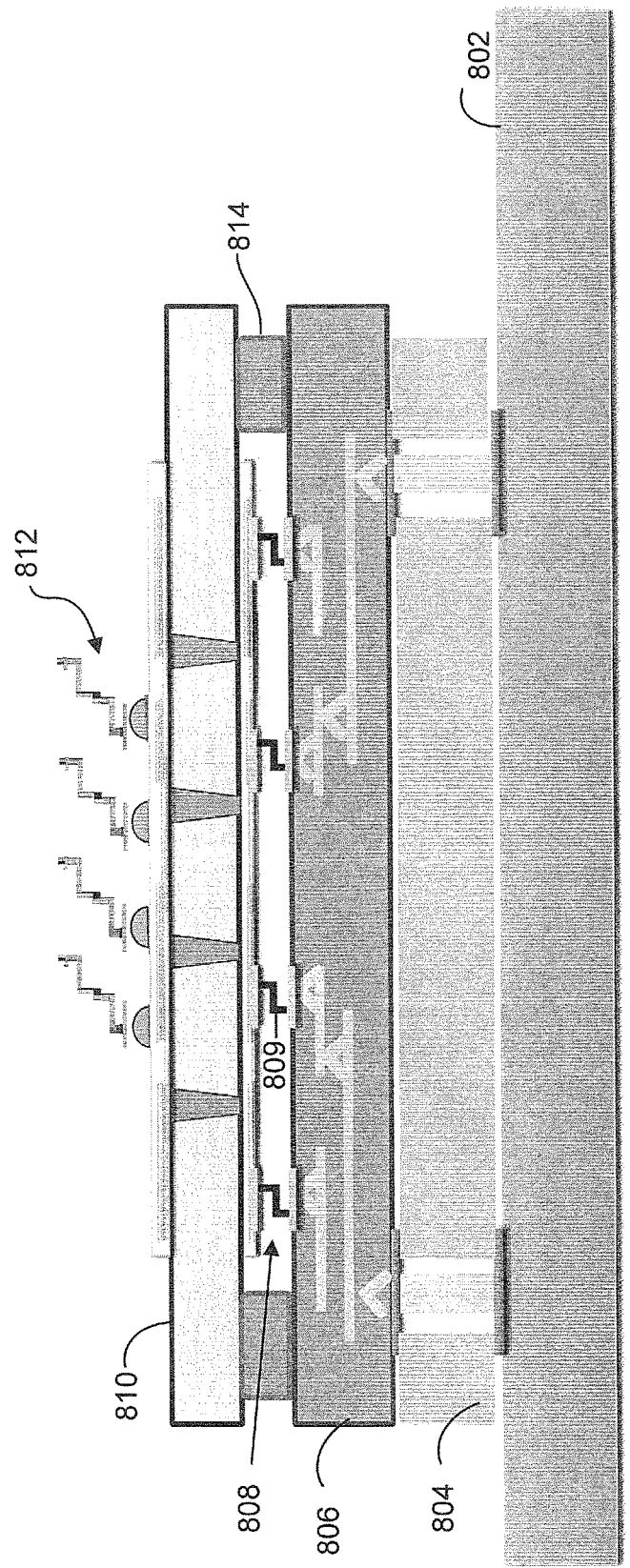

LOW OVERDRIVE PROBES WITH HIGH OVERDRIVE SUBSTRATE

TECHNICAL FIELD

The present disclosure relates generally to the field of semiconductor device testing and more specifically to the field of probe cards for semiconductor testing.

BACKGROUND

Current electrical probe designs suffer from limitations in both design and manufacturing. Considerations include an increasing number of input/output channels, grounds, and power/electrical contact points and a decreasing array pitch size. Such limitations or concerns arise primarily because current probe designs require semiconductor solder pads or bumps to be mechanically engaged by a probe that continues travelling along a path substantially orthogonal to the surface of the semiconductor device even after initial contact to ensure a stable contact. This continuing travel is often called vertical overdrive and is used to ensure that each probe of a probe card contacts a corresponding contact point of the semiconductor device regardless of local or system variations (e.g., local non-planarity, semiconductor device tilting, and local height variations of pads). A prescribed amount of overdrive may be required (to meet a compliance requirement) to ensure that the probe card and its probes are able to absorb any of the local or device-wide variations to ensure that each probe has a stable contact with its target solder pad or bump.

With the grid array pitch size also becoming smaller, a space that may be used for an individual probe is also limited. It is extremely challenging to maintain an exact displacement while decreasing the size of a probe. This is because stresses to the probe may increase and exceed the probe material limits for yield strength and fatigue. For example, for a simple cantilever design, when a probe length is reduced by half, the maximum possible stress increases by a factor of four, for the same overdrive.

Reducing a required amount of overdrive is not a good option, given the above described local and device-wide variations. A long vertical probe may be a solution to address a large overdrive and high force requirement, but is not an ideal solution when considering signal integrity and cross talk requirements. Also, low probe resistance and high current carrying capacity may be requirements for the probe card. With limited space, a cross-section of the probe will also reduce, causing an increase in resistivity and reduction in current carrying capacity.

Other significant challenges pertain to manufacturing a probe with a sufficient overdrive capability to absorb local and device-wide variations. As the pitch between solder bumps or pads grows smaller, so does the real estate and the volume of space available for each individual probe. As the space allocated for each probe shrinks, it becomes increasingly difficult to construct a mechanical design that allows for large overdrives while maintaining stress levels at any point along the probe below the material maximum yield stress.

SUMMARY OF THE INVENTION

Embodiments of this present invention provide solutions to the challenges inherent in testing semiconductor devices with probe cards. In a method according to one embodiment of the present invention, a method for testing a semiconductor device is disclosed. The method comprises positioning a probe card comprising a plurality of probes above the semiconductor device and moving the probe card in a vertical direction towards the semiconductor device. The plurality of probes are moved in a vertical direction towards a plurality of electrical structures of the semiconductor device until each probe of the plurality of probes has made mechanical contact with a corresponding electrical structure of the plurality of electrical structures with a minimum quantity of force. The each probe of the plurality of probes absorbs a portion of vertical overdrive after contacting their corresponding electrical structures. The probe card absorbs any remaining vertical overdrive. The vertical overdrive is a continuing vertical movement of the plurality of probes after a first probe of the plurality of probes mechanically contacts a first corresponding electrical structure.

In an apparatus according to one embodiment of the present disclosure, an apparatus for electrically testing a semiconductor device is disclosed. The apparatus comprises a probe card comprising a plurality of probes. The probe card is operable to move a plurality of probes in a vertical direction towards a plurality of electrical structures of the semiconductor device until each probe of the plurality of probes has made mechanical contact with a corresponding electrical structure of the plurality of corresponding electrical structures with a minimum quantity of force. The each probe of the plurality of probes is operable to absorb a portion of vertical overdrive after contacting their corresponding electrical structures. The probe card is further operable to absorb any remaining vertical overdrive. The vertical overdrive is a continuing vertical movement of the plurality of probes after a first probe of the plurality of probes mechanically contacts a first corresponding electrical structure.

In a computer system according to one embodiment of the present invention, a computer-readable medium having computer-readable program code embodied therein for causing the computer system to perform a method for testing a semiconductor device is disclosed. The method comprises positioning a probe card comprising a plurality of probes above the semiconductor device and moving the probe card in a vertical direction towards the semiconductor device. The plurality of probes are moved in a vertical direction towards a plurality of electrical structures of the semiconductor device until each probe of the plurality of probes has made mechanical contact with a corresponding electrical structure of the plurality of electrical structures with a minimum quantity of force. The each probe of the plurality of probes absorbs a portion of vertical overdrive after contacting their corresponding electrical structures. The probe card absorbs any remaining vertical overdrive. The vertical overdrive is a continuing vertical movement of the plurality of probes after a first probe of the plurality of probes mechanically contacts a first corresponding electrical structure.

BRIEF DESCRIPTION OF THE DRAWINGS

Embodiments of this present invention will be better understood from the following detailed description, taken in conjunction with the accompanying drawing figures in which like reference characters designate like elements and in which:

FIG. 8 illustrates an exemplary schematic cross-section of a probe card with low overdrive probes and high overdrive probes in accordance with an embodiment of the present invention;

DETAILED DESCRIPTION

Figure 1A:
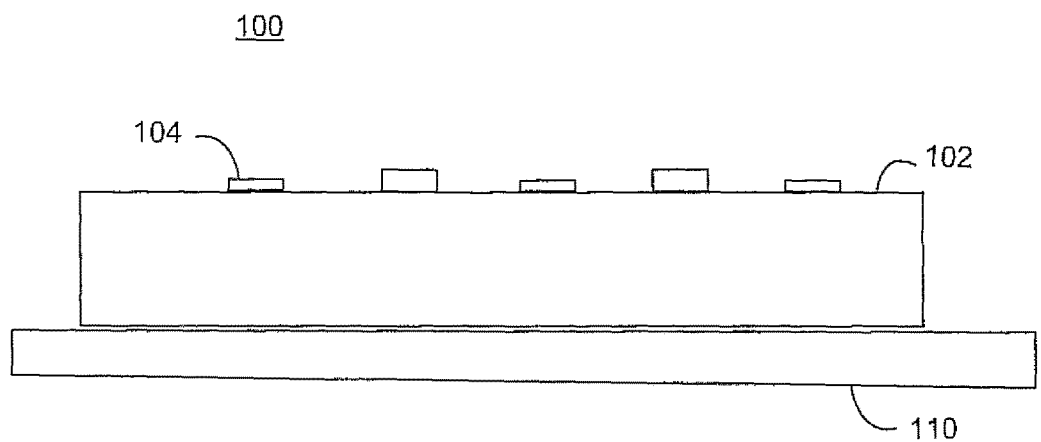
FIG. 1A illustrates an exemplary schematic cross-section of a semiconductor device under test with solder pads in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Embodiments of this present invention provide solutions to the increasing challenges inherent in manufacturing probes that are capable of absorbing a required amount of vertical overdrive to remain in compliance. As discussed herein, various embodiments dispense with large vertical probes with high overdrive absorbing capacities, in favor of splitting the required overdrive between a low overdrive probe and a high overdrive probe card. An exemplary low-overdrive micro electro-mechanical system (MEMS) probe may be used to absorb local height variations on the semiconductor wafer while still making effective contact at low overdrives. As discussed herein, such low-overdrive probes may be easily manufactured given that these probes address only local variations. The geometry of low-overdrive probes may also be kept small to provide good contact resistance, current carrying capability, and good signal integrity. As also discussed herein, any remaining overdrive may be absorbed through the use of a probe card with secondary probes such as: one or more spring interposers which may include POGO pin interposers, elastomeric interposers, etc. The two overdrive contributions added together provide ample margin for testing.

The compliance for the probe card may come from macro secondary probes (e.g., elastomeric probes) or springs in various layers of the probe card. For example, suitable secondary probes may be bonded between a probe head and a substrate to act as an interposer as well as to provide compliance for the whole probe head. Another example may be to have suitable secondary probes, such as elastomeric springs, bonded between a fine pitch space transformer and a regular space transformer. As discussed herein, the use of one or more of these exemplary secondary probes as elastomeric interposers in a probe card may provide the necessary additional overdrive and force to the low-overdrive probes.

Size, spacing, and orientation of probe cards, probes, semiconductor devices, and electrical structures of the semiconductor devices illustrated in FIGS. 1-12 have been exaggerated for the sake of clarity. Furthermore, while an exemplary semiconductor wafer may comprise thousands of electrical structures (e.g. components, solder runs, pads, bumps, etc.) and an exemplary probe card may comprise several layers and thousands of probes, for the sake of clarity, semiconductor wafers and probe cards discussed herein and illustrated in FIGS. 1-12 are simplified such that only a limited quantity of solder pads or bumps are illustrated and a limited quantity of probes are illustrated. In one embodiment, an exemplary probe may comprise many hundreds or thousands of probes that are concentrated into one area to test a semiconductor device, such as a processor (e.g., a computer processor or smart phone processor) and each of these probes will need to be properly aligned with a target solder pad or bump on the semiconductor device. As discussed herein, such fine pitch requirements may be met through the use of MEMS probes.

FIG. 1A illustrates an exemplary schematic cross-section of a semiconductor wafer under test 100 with solder pads 104. As illustrated in FIG. 1A, a semiconductor wafer 100 comprises a substrate 102 and a plurality of solder pads 104 (also referred to as electrical structures). As also illustrated in FIG. 1A, the solder pads 104 may be of differing thicknesses, causing a varying local planarity or local height variation. FIG. 1A also illustrates that an exemplary tilt to the orientation of the semiconductor wafer 100 may cause a variation that affects the entire semiconductor wafer 100. For the sake of clarity, an exaggerated tilt in the semiconductor wafer 100 due to an exaggerated non-planarity of the chuck 110 (used for holding and positioning the semiconductor wafer 100) is illustrated in FIG. 1A. In one embodiment, the chuck 110 is a vacuum chuck. In one embodiment, such variations, also referred to as system variations, may be caused by the non-planarity of the chuck 110 and a thickness variation of the semiconductor wafer 100. Tilt may also come from how a probe card is aligned to the semiconductor wafer 100. FIGS. 4A, 4B, 5A, 5B, 6A, 6B, 7A, and 7B, as discussed herein, also illustrate portions of semiconductor wafers and chucks with exaggerated tilts to demonstrate mating an exemplary probe card to a semiconductor wafer while overcoming tilt and/or non-planarity variations between the probe card, semiconductor wafer, and/or chuck.

Figure 1B:
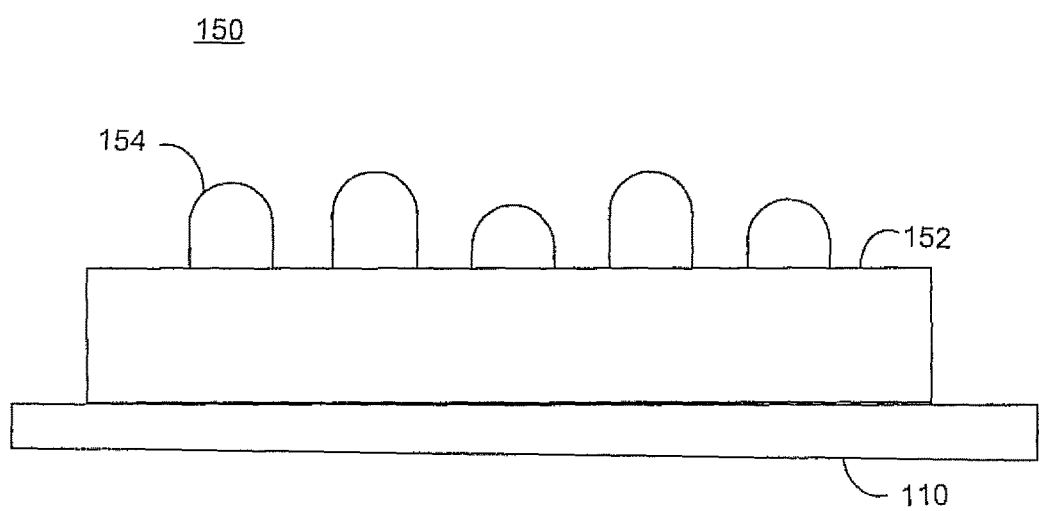
FIG. 1B illustrates an exemplary schematic cross-section of a semiconductor device under test with solder bumps in accordance with an embodiment of the present invention.

FIG. 1B illustrates an exemplary schematic cross-section of a semiconductor wafer under test 150 with solder bumps 154. As illustrated in FIG. 1B, the semiconductor wafer 150 comprises a substrate 152 and a plurality of solder bumps 154 (also referred to as electrical structures). As also illustrated in FIG. 1B, the solder bumps 154 may also be of differing thicknesses, causing a varying local planarity or local height variation. FIG. 1B also illustrates an exemplary tilt (when mounted on chuck 110) as discussed above, introducing a system variation.

Overdrive Compliance while Meeting Fine Pitch Requirements:

When dealing with fine pitches (50 microns or less), it may be difficult to manufacture a vertical probe with the required accuracy to contact a target pad or bump that may be only 15-20 microns in size. Such small pitch requirements may be met with a probe card with MEMS probes. In one exemplary embodiment, MEMS probes may have 10 micron dimensional features. In one embodiment, MEMS probes have a spring-like structure that is very accurate in position, have an adequate amount of force to make good contact to the device under test, but do not have a lot of overdrive. A MEMS probe designed for providing a large overdrive may be too complex to fabricate and may not provide the force required to make good contact.

In one exemplary embodiment, a probe card may have probes that have a certain amount of spring-like ability to meet a compliance requirement (a proscribed quantity of force or overdrive to ensure a stable contact between a probe and a target solder pad). This spring-like ability must also be able to absorb any local variations in bump geometries in the semiconductor wafer being tested. Overdrive may be defined as a number of microns a spring is required to compress to ensure a compliance-meeting stable contact between a probe and a solder pad of a semiconductor device under test.

For example, a probe with a 25 micron overdrive requirement will need to compress at least 25 microns before a stable contact between itself and a target solder pad or bump is achieved. In addition to the minimum overdrive required for stable contact, there are also local and system planarity variations, as discussed herein, that will need to be absorbed. These variations need to be taken into account when determining a required amount of overdrive. An exemplary system planarity variation may be on the order of 20-25 microns. Therefore, there will need to be a minimum of 45-50 microns of overdrive (20-25 microns due to system variation and 25 microns for the probe) to meet compliance requirements and achieve a stable contact between the above exemplary probes and corresponding target solder pads/ bumps.

However, with MEMS probes, which are well suitable for fine pitch applications, there may not be enough overdrive available to meet compliance requirements. As noted above, while an overdrive needed to meet compliance requirements due to system variation may be 20-25 microns and an overdrive need to meet overdrive compliance requirements of a MEMS probe may be 5-20, therefore, the MEMS probe may be unable to achieve the exemplary overall overdrive compliance requirement of a minimum of 25 microns or more. In other words, after meeting its own overdrive requirements, the MEMS probe may not have enough overdrive capacity left to meet the minimum amount of overdrive necessary to absorb the system variations. In other words, low overdrive MEMS probes may completely bottom out. Therefore, as noted above, the remaining microns of overdrive necessary to meet the compliance requirements to ensure stable contact between probes and target solder pads/bumps, across the whole wafer must be found somewhere else.

As discussed herein, one solution is to use a global compliant probe card. When the probe card is driven to contact the device under test, the MEMS probes start to compress while the entire substrate holding the MEMS probes also compresses due to the presence of a matching spring body under the substrate which is designed with an appropriate spring constant. Thus there is an overdrive contribution from both the MEMS and the interposer springs underneath the substrate. While there is enough overdrive and force in the probes to absorb local variations and make good electrical contact, the larger overdrive capacity of the secondary probes in the probe card will provide the additional overdrive necessary to ensure there is a stable contact between probes and solder pads/bumps across the semiconductor wafer. In one embodiment, low overdrive MEMS probes can completely bottom out and then transfer the force to the secondary probes. Such a bottom out of MEMS probes may be seen in situations where a total MEMS probe count is small.

In one embodiment, due to system variations, some probes will be making contact with their target solder pads/bumps after an overdrive of 10 microns while the same probes at another location on the wafer will be making contact with their target solder pads/bumps after an overdrive of 20 microns due the system variation.

In one embodiment, as discussed herein, rather than low-overdrive probes, a probe card with an elastomeric interposer may comprise rigid probes with an infinite spring constant. Such an arrangement may be suitable when the necessary compliance is absorbed by an elastomeric interposer in the probe card and by the rigid probes penetrating and imbedding themselves into their respective solder bump (using a thick enough solder bump so that all of the remaining variation may be absorbed by the solder bump). But with fine pitches, care is taken to ensure that the local and system variations are minimized so that the elastomeric interposer of the probe card and the solder bumps are able to fully absorb the local and system variations and the probe overdrive necessary for compliance. In one embodiment, the overdrive of the probe card is sufficient to absorb the majority of the overdrive needed for compliance such that rigid probes will only slightly embed themselves into their respective fine pitch solder bumps.

Figure 2A:
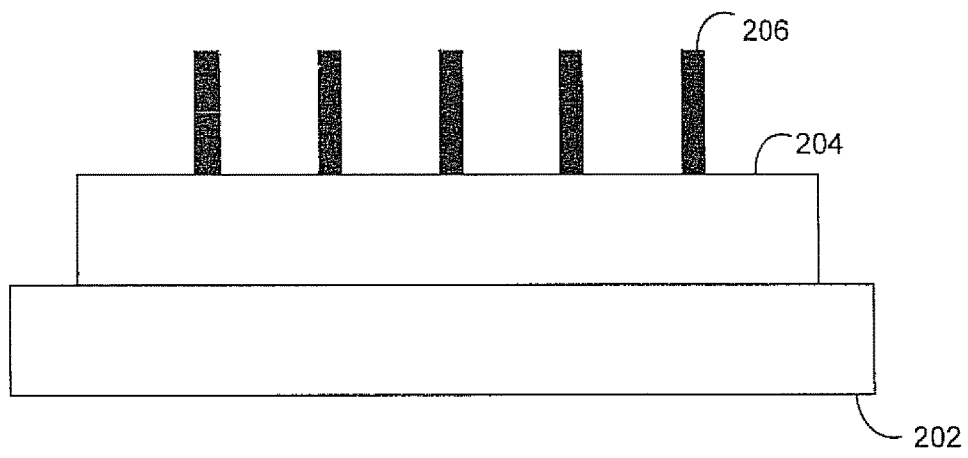
FIG. 2A illustrates an exemplary schematic cross-section of a probe card with rigid probes in accordance with an embodiment of the present invention.

Probe/Probe Card Combination Embodiments:

FIG. 2A illustrates an exemplary schematic cross-section of a probe card 200 with rigid probes 206. As illustrated in FIG. 2A, the probe card 200 comprises a substrate 202, an interposer and/or space transformer 204, and a plurality of rigid probes 206. As discussed herein, the probe card 200 illustrated in FIG. 2A does not provide any level of compliance because the probes 206 and probe card 200 are rigid and will not absorb any of the force when the probes 206 of the probe card 200 are applied to target solder pads. In other words, the probe card 200 of FIG. 2A is unable to apply a prescribed amount of vertical overdrive to ensure that the probes 206 of the probe card 200 are in stable contact with their corresponding target electrical structures because the probes 206 are rigid and unable to absorb any of the applied vertical overdrive. An exemplary interposer or space transformer 204 may be used to route a test signal from a larger pitch to a smaller pitch.

Figure 2B:
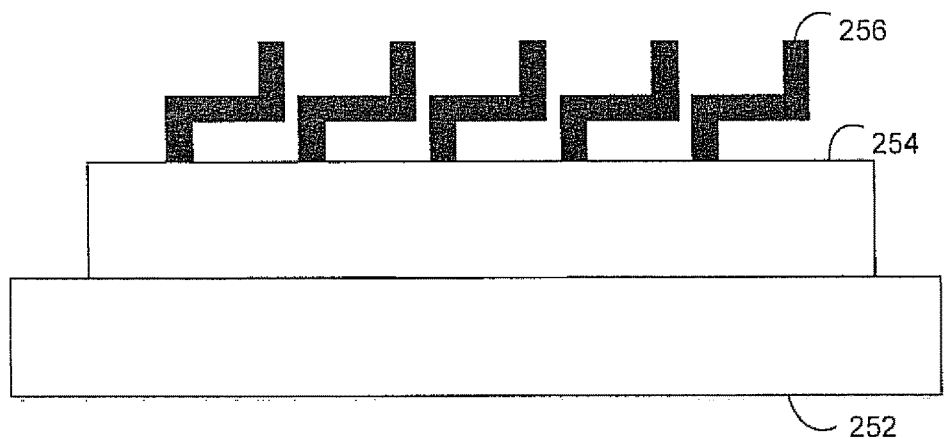
FIG. 2B illustrates an exemplary schematic cross-section of a probe card with MEMS probes in accordance with an embodiment of the present invention.

FIG. 2B illustrates an exemplary schematic cross-section of a probe card 250 with compliant probes 256. As illustrated in FIG. 2B, the probe card 250 comprises a substrate 252, an interposer and/or space transformer 254, and a plurality of compliant probes 256. As discussed herein, the probe card 250 illustrated in FIG. 2B provides a limited amount of compliance because the complaint probes 256 are able to absorb a quantity of vertical overdrive. In one embodiment, the compliant probes 256 are able to absorb 10 microns of vertical overdrive. In another embodiment, the compliant probes 256 are able to absorb 5 microns of vertical overdrive. In one embodiment, the compliant probes 256 are micro electro-mechanical system (MEMS) probes, which are able to absorb a limited amount of local height variations between the probes 256 and their corresponding target electrical structures on the device under test.

Figure 3A:
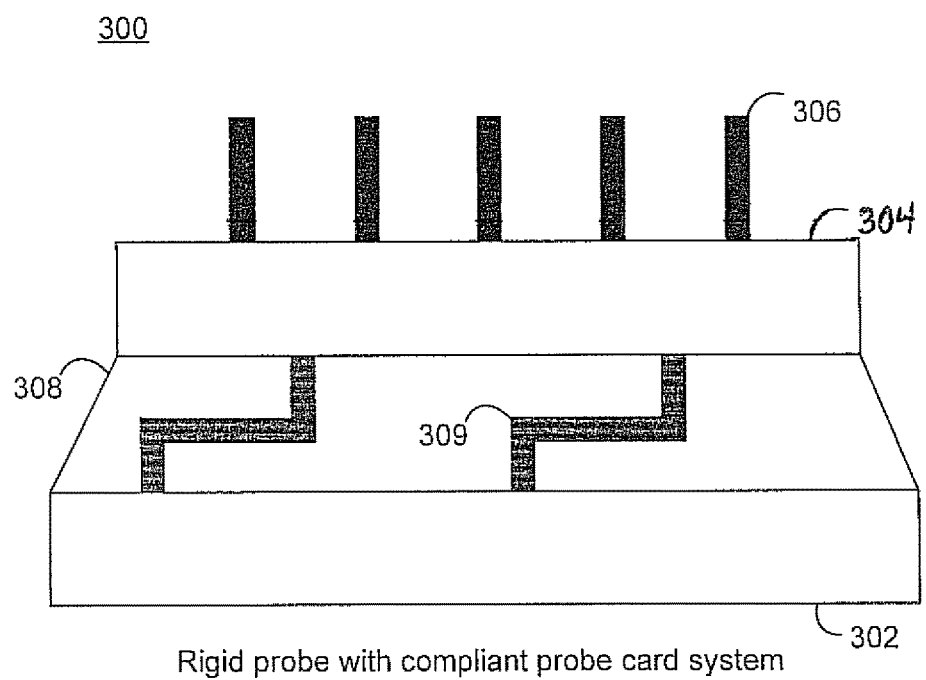
FIG. 3A illustrates an exemplary schematic cross-section of a probe card with rigid probes and a layer of secondary probes in accordance with an embodiment of the present invention.

FIG. 3A illustrates an exemplary schematic cross-section of a probe card 300 with rigid probes 306 and a layer of secondary probes 308 (e.g., elastomeric springs, etc.). As illustrated in FIG. 3A, an exemplary probe card 300 comprises a substrate 302, a layer of secondary probes 308 that may absorb a prescribed quantity of vertical overdrive, a space transformer 304, and a plurality of rigid probes 306. In one exemplary embodiment, the layer of secondary probes 308 is an elastomeric interposer layer. In one embodiment, the layer of secondary probes 308 comprises a plurality of springs 309 that function as interposers between the layers. As discussed herein, while the rigid probes 306 of the probe card 300 may not be able to absorb local planarity variations as they are unable to absorb vertical overdrive, the layer of secondary probes 308 within the probe card 300 is able to absorb a quantity of vertical overdrive such that a quantity of system variations are absorbed.

Figure 3B:
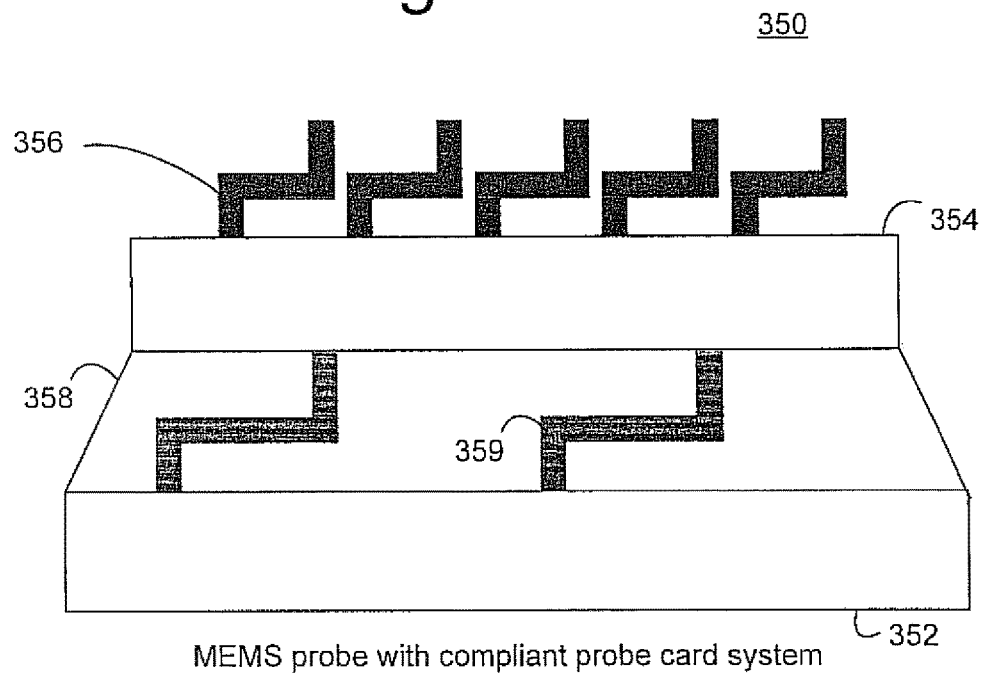
FIG. 3B illustrates an exemplary schematic cross-section of a probe card with MEMS probes and a layer of secondary probes in accordance with an embodiment of the present invention.

FIG. 3B illustrates an exemplary schematic cross-section of a probe card 352 with compliant probes 356 and a layer of secondary probes 358 in accordance with an embodiment of the present invention. As illustrated in FIG. 3B, an exemplary probe card 350 comprises a substrate 352, a layer of secondary probes 358 that may absorb a prescribed quantity of vertical overdrive, a space transformer 354, and a plurality of compliant probes 356. In one exemplary embodiment, the layer of secondary probes 358 is an elastomeric interposer layer. In one embodiment, the layer of secondary probes 358 comprises a plurality of springs 359 that function as interposers between layers. As discussed herein, the compliant probes 356 are able to absorb an amount of local planarity variations when they are absorbing a quantity of vertical overdrive. In one embodiment, the compliant probes 356 are able to absorb vertical overdrive coming from local planarity differences. In another embodiment, the layer of secondary probes 358 is able to absorb a quantity of vertical overdrive, such that system variations are absorbed.

Example Test Scenarios with a Variety of Probe/Probe Card Arrangements:

The semiconductor wafers 100, 150, and probe cards 200, 250, 300, 350 may be arranged into the following four scenarios illustrated in table 1 below.

TABLE 1

| Probe card configuration | Effective spring constant of probes | Effective spring constant of probe card | Result | Applications Addressed |
|---|---|---|---|---|
| Rigid probe, non compliant probe card system | Infinite | Infinite | Compliance absorbed by solder bumps. | Larger solder bumps where the probes penetrate into solder |
| MEMS probe, non-compliant probe card system | N*K1s | Infinite | Low OD probe card, suitable for probing dies with little system planarity variation | Larger/small solder bumps, pads, without much system planarity variation |
| Rigid probe, compliant probe card system | Infinite | As designed | Limits the max force on the wafer. | Local bump variation is absorbed by solder bump penetration |
| MEMS probe, compliant probe card system | N*K1s | As designed | Large overall OD, suitable for pads or bumps | All applications including fine pitch |

The exemplary probe card/probe combinations illustrated in FIGS. 2A, 2B, 3A, and 3B, and compared in Table 1 follow the following assumptions:

1) A total force for a MEMS probe is $N_1$ with a spring constant of K1s.

2) A total force for a compliant probe card is $N_2$ with a spring constant of K2s.

$$An\ overdrive\ for\ MEMS\ probes = \frac{F}{(N_1 * K1s)}.$$

$$An\ overdrive\ for\ a\ compliant\ probe\ card = \frac{F}{(N_2 * K2s)}.$$

A total overdrive for a MEMS probe/compliant probe card assemly =

$$\frac{F}{(N_1 * K1s)} + \frac{F}{(N_2 * K2s)}.$$

Therefore, if $N_1 = 10N_2$, and a same spring constant is used for both the MEMS probes and the compliant probe card, a 1 micron overdrive for the MEMS probes will correspond to a 10 micron overdrive for the compliant probe card. However, in various embodiments, the spring constants between the MEMS probes and the compliant probe cards may be different.

The variety of probe cards illustrated in FIGS. 2A, 2B, 3A, and 3B are suitable for a variety of uses as illustrated in Table 1. For example, a rigid probe 206 paired with a non-compliant probe card 200, as illustrated in Table 1 and FIG. 2A, provides an infinite spring constant in both the probes 206 and the probe card 200 and therefore, any overdrive compliance must be absorbed by solder bumps (neither the probe nor the probe card have spring properties and would therefore have infinite spring constants and be unable to absorb any vertical overdrive). This first combination may be used with larger solder bumps where the rigid probes 206 may penetrate sufficiently into the solder bump to absorb the vertical overdrive when the overall overdrive compliance value is able to be absorbed by the solder bumps.

A MEMS probe 256 paired with a non-compliant probe card 250, as illustrated in Table 1 and FIG. 2B, provides a probe spring constant of N*K1s and an infinite spring constant in the probe card 250. MEMS probes 256 paired with a non-compliant probe card 250 have a small amount of overdrive compliance capability and are suitable for probing both solder pads and solder bumps when there is little system variation.

A rigid probe 306 paired with a compliant probe card 300, as illustrated in Table 1 and FIG. 3A, provides an infinite probe spring constant and an "as designed" spring constant for the probe card 300, where a spring constant for the probe card 300 may be selected for manufacture. In one embodiment, such a probe 306 and probe card 350 combination may limit a maximum force exerted on a device under test, but may not be suitable for probing solder or metal pads. As discussed herein, such a combination may be used to absorb local solder bump variations by solder bump penetration and absorb system level variations by the flexibility of the probe card 300.

Lastly, a MEMS probe 356 paired with a compliant probe card 350, as illustrated in Table 1 and FIG. 3B, provides a probe constant of N*K1s and a probe card constant as designed, where a spring constant for the probe card 350 may be selected for manufacture. In one embodiment, a low-overdrive probe 356 and compliant probe card 350 may be used to provide a large overall overdrive and may be suitable for both solder bumps and solder pads. This combination may also be suitable for increasingly fine pitch sizes. In one embodiment, the MEMS probe 356 may absorb local compliance requirements (to deal with local variations)

for solder pads/bumps while system variation may be absorbed by the flexibility in the probe card 350.

Figure 4A:
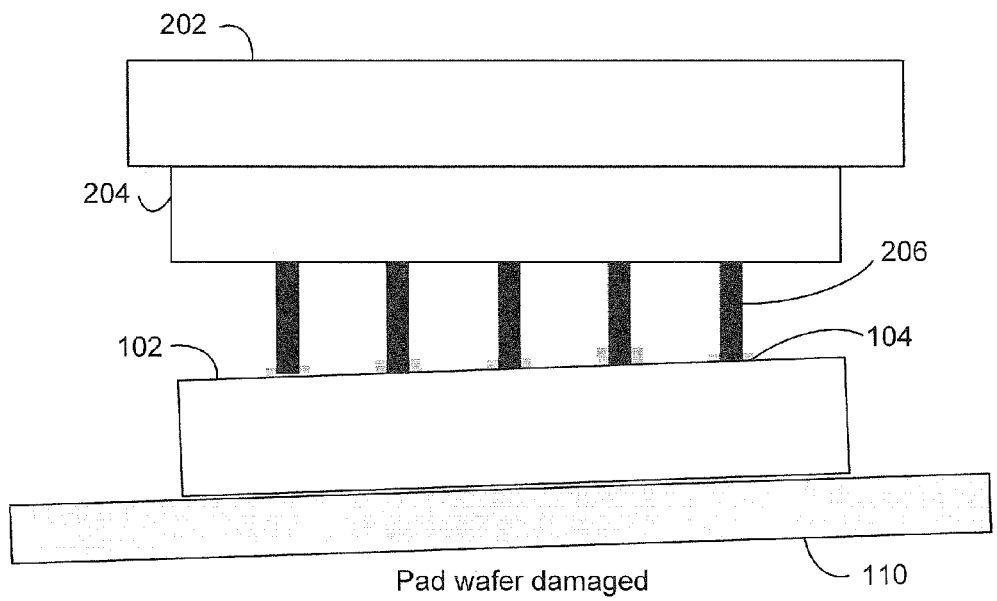
FIG. 4A illustrates an exemplary schematic cross-section of the probe card with rigid probes of FIG. 2A mated with the semiconductor device under test with solder pads of FIG. 1A in accordance with an embodiment of the present invention.

FIG. 4A illustrates an exemplary schematic cross-section of a probe card 200 with rigid probes 206, mounted on a chuck 110 and mated with a semiconductor wafer 100 with solder pads 104. As discussed herein, the variations illustrated are exaggerated for the sake of clarity. As illustrated in FIG. 4A, because the probes 206 and probe card 200 have no compliant properties, there will be no overdrive absorption and the probes 206 may be driven into the solder pads 104 if the variation is too great. As illustrated in FIG. 4A, the amount of overdrive required to ensure a stable contact across the probe card 200 may result in damaged solder pads 104 and damage the wafer if the amount of overdrive is too high.

Figure 4B:
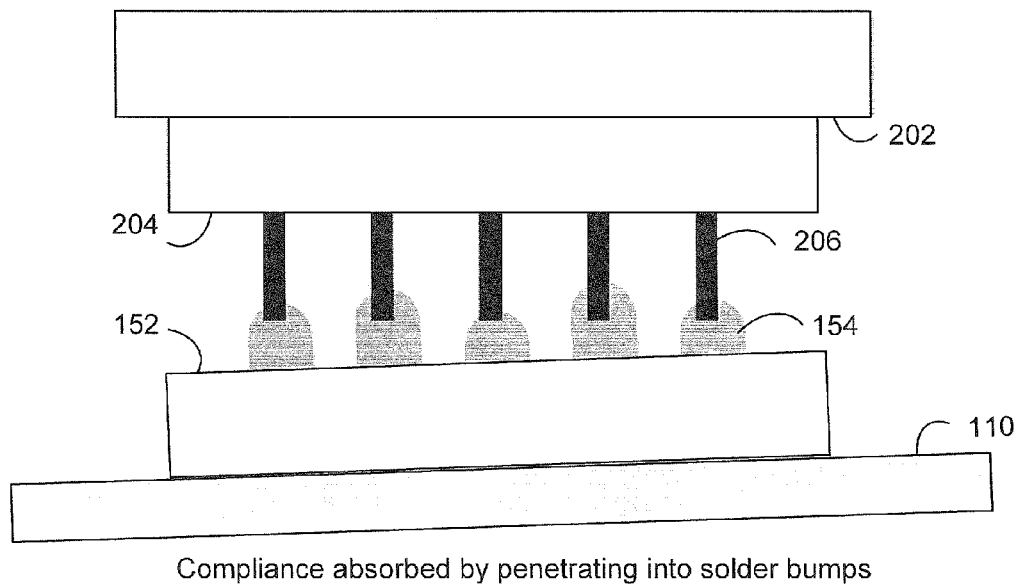
FIG. 4B illustrates an exemplary schematic cross-section of the probe card with rigid probes of FIG. 2A mated with the semiconductor device under test with solder bumps of FIG. 1B in accordance with an embodiment of the present invention.

FIG. 4B illustrates an exemplary schematic cross-section of a probe card 200 with rigid probes 206, mounted on a chuck 110 and mated with a semiconductor wafer 150 with solder bumps 154. As discussed herein, the variations illustrated are exaggerated for the sake of clarity. As illustrated in FIG. 4B, because the probes 206 and probe card 200 have no compliant properties, any overdrive absorption will be accomplished by the probes 206 penetrating into the solder bumps 154. Therefore, if there is a planarity variation, the overdrive needed to accommodate the variations may be absorbed by penetrating the solder bumps 154.

Figure 5A:
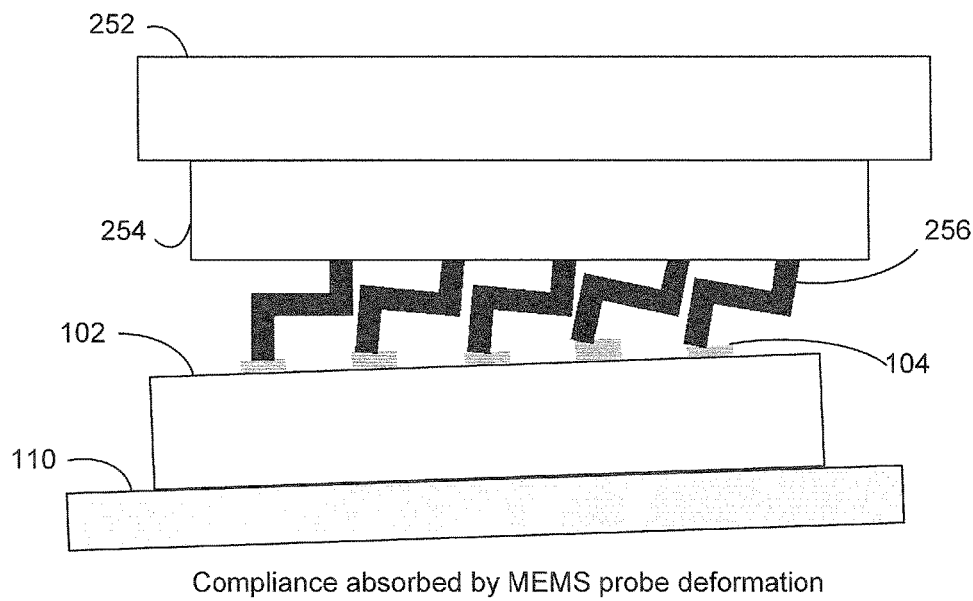
FIG. 5A illustrates an exemplary schematic cross-section of the probe card with MEMS probes of FIG. 2B mated with the semiconductor device under test with solder pads of FIG. 1A in accordance with an embodiment of the present invention.
Figure 5B:
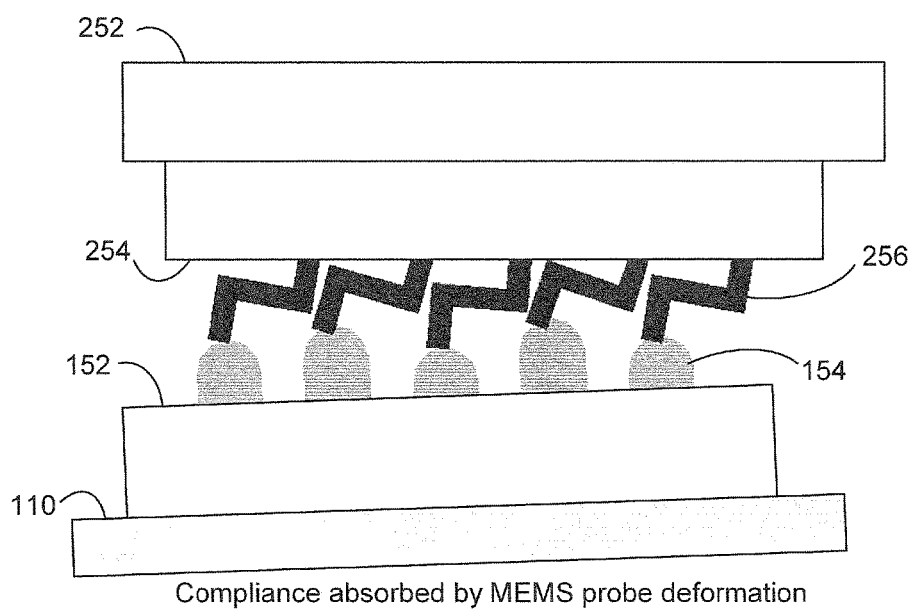
FIG. 5B illustrates an exemplary schematic cross-section of the probe card with secondary probes of FIG. 2B mated with the semiconductor device under test with solder bumps of FIG. 1B in accordance with an embodiment of the present invention.

FIGS. 5A and 5B illustrate an exemplary schematic cross-section of a probe card 250 with compliant probes 256, mounted on chuck 110 and mated with a semiconductor wafer with either solder pads 104 or solder bumps 154. As discussed herein, the variations illustrated are exaggerated for the sake of clarity. As illustrated in FIGS. 5A and 5B, the compliance is absorbed by compliant probe 256. In one embodiment, the compliant probes 256 are MEMS probes. With a compliant probe (e.g., a MEMS probe) and a non-compliant probe card, as illustrated in FIGS. 5A and 5B, there is a small amount of overdrive compliance capability. So long as any system variation is minimized, the compliance-required amount of overdrive may be absorbed.

Figure 6A:
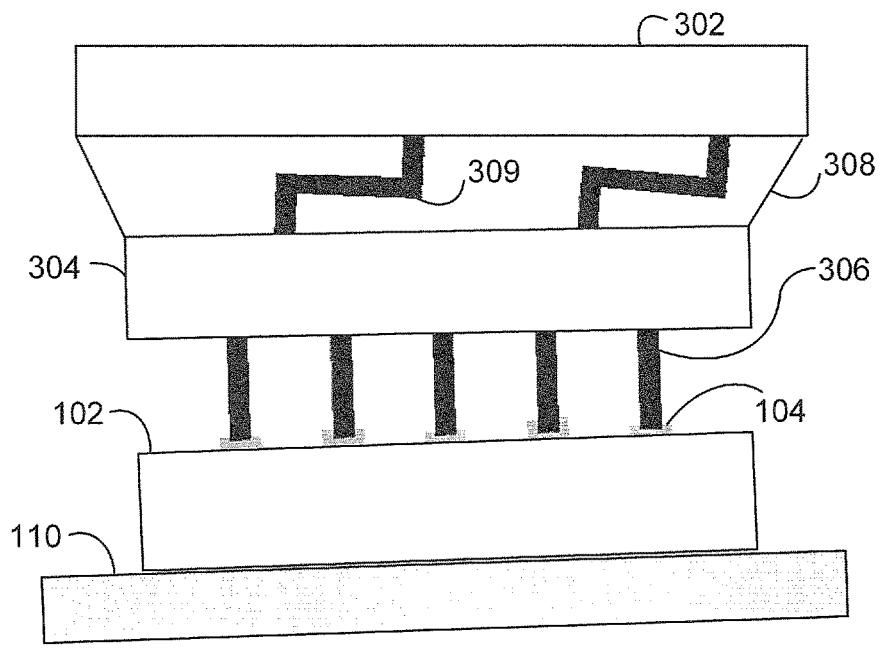
FIG. 6A illustrates an exemplary schematic cross-section of the probe card with rigid probes and a layer of secondary probes of FIG. 3A mated with the semiconductor device under test with solder pads of FIG. 1A in accordance with an embodiment of the present invention.
Figure 6B:
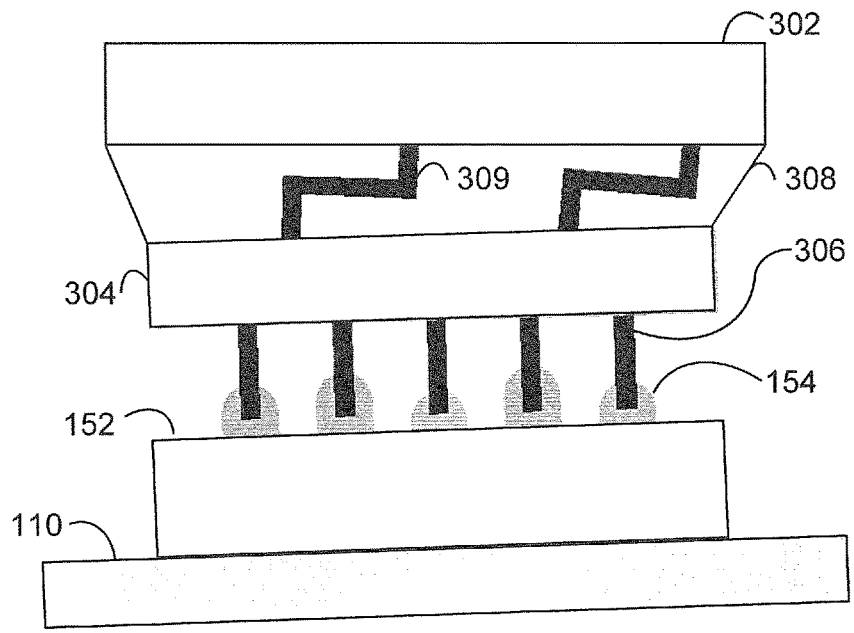
FIG. 6B illustrates an exemplary schematic cross-section of the probe card with rigid probes and a layer of secondary probes of FIG. 3A mated with the semiconductor device under test with solder bumps of FIG. 1B in accordance with an embodiment of the present invention.

FIGS. 6A and 6B illustrate an exemplary schematic cross-section of a probe card 300 with rigid probes 306, mounted on a chuck 110 and mated with a semiconductor wafer with either solder pads 104 or solder bumps 154. As discussed herein, the variations illustrated are exaggerated for the sake of clarity. As illustrated in FIGS. 6A and 6B, a maximum force exerted on the semiconductor wafer is limited by a layer of secondary probes 308 in the probe card 300. In one embodiment, as illustrated in FIG. 6B, local solder bump variations may be absorbed by solder bump penetration.

Figure 7A:
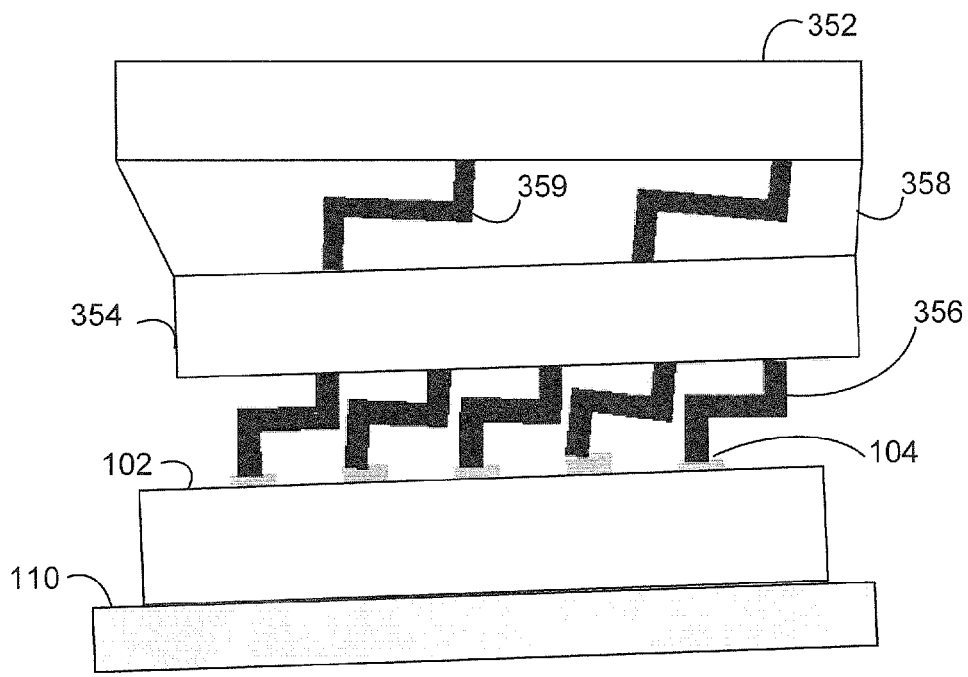
FIG. 7A illustrates an exemplary schematic cross-section of the probe card with complaint probes and a layer of secondary probes of FIG. 3B, mated with the semiconductor device under test with solder pads of FIG. 1A in accordance with an embodiment of the present invention.
Figure 7B:
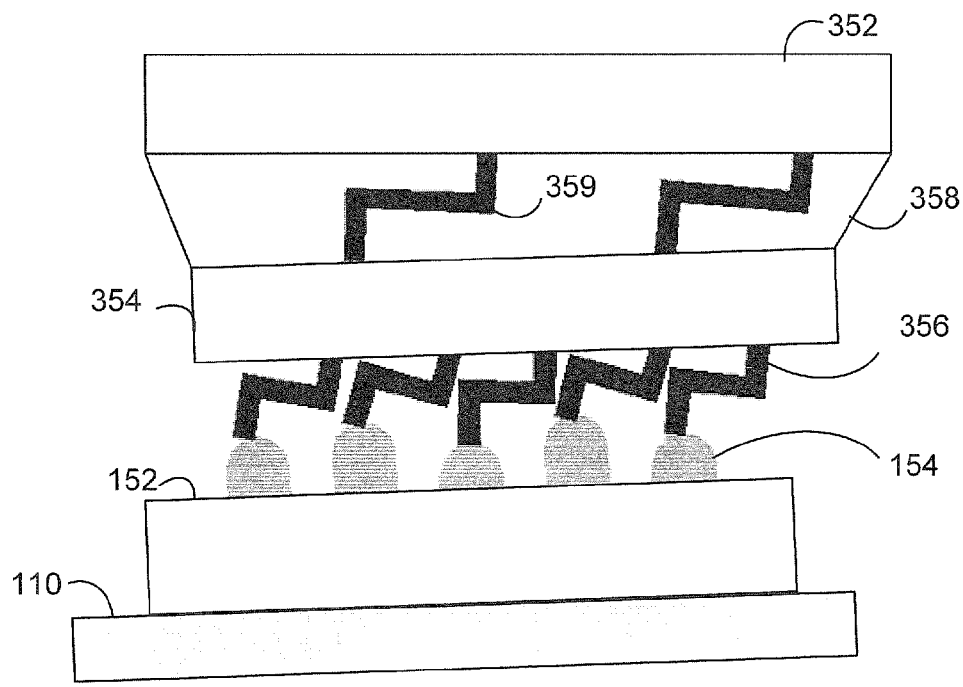
FIG. 7B illustrates an exemplary schematic cross-section of the probe card with compliant probes and a layer of secondary probes of FIG. 3B mated with the semiconductor device under test with solder bumps of FIG. 1B in accordance with an embodiment of the present invention.

FIGS. 7A and 7B illustrate an exemplary schematic cross-section of a probe card 350 with compliant probes 356 and a layer of secondary probes 358, mounted on a chuck 110 and mated with a semiconductor wafer with either solder pads 104 or solder bumps 106. As discussed herein, the variations illustrated are exaggerated for the sake of clarity. In one embodiment, with a low overdrive MEMS probe 356 and a high overdrive probe card 300, an overall large overdrive is provided. Such a combination may be useful in all applications; including fine pitch sizes in both solder pads and solder bumps.

Exemplary Embodiments:

FIG. 8 illustrates an exemplary schematic cross-section of a probe card 800 with compliant probes 812 and a layer of secondary probes 808. As illustrated in FIG. 8, the probe card 800 comprises a substrate or PCB layer 802, an interposer 804, a space transformer 806, a layer of fine pitch secondary probes 808, a fine pitch space transformer 810, and a plurality of compliant probes 812. In one embodiment, the compliant probes 812 are MEMS probes. In one embodiment, the layer of fine pitch secondary probes 808 comprises a carbon nano tube interposer providing electrical connections as well as the desired additional compliance for the low-overdrive probes 812. In one embodiment, the layer of fine pitch secondary probes 808 comprises elastomeric springs 809 that provide electrical connections and the desired additional overdrive compliance.

In one embodiment, the layer of fine pitch secondary probes 808 is permanently bonded between the fine pitch space transformer 810 and the space transformer 806. In one embodiment, the fine pitch space transformer 810 and the space transformer 806 are permanently bonded 814 with the layer of fine pitch secondary probes 808 between them. The permanent bond 814 is an elastic bond with a very low spring constant as compared to a spring constant of the layer of fine pitch secondary probes 808. By permanently binding the layers sandwiching the layer of fine pitch secondary probes 808, the probe card 800 is able to share in system overdrive compliance.

Figure 9:
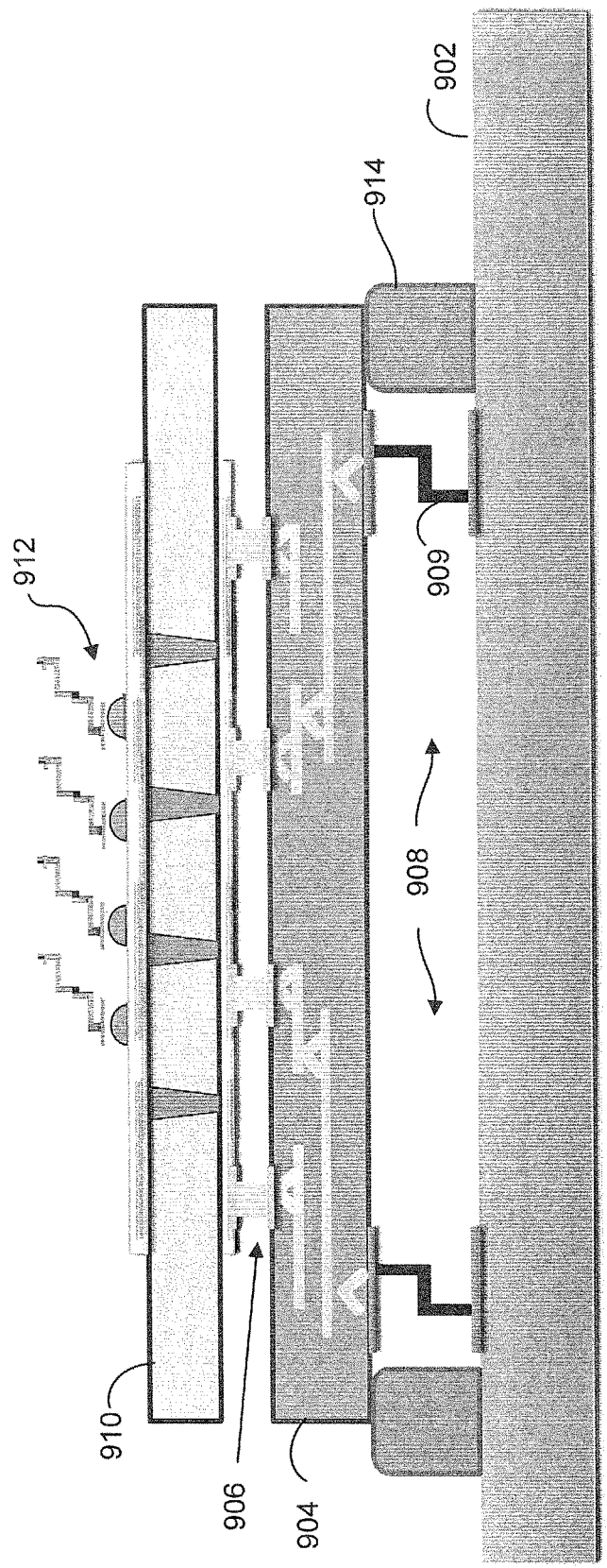
FIG. 9 illustrates an exemplary schematic cross-section of a probe card with low overdrive probes and high overdrive probes in accordance with an embodiment of the present invention.

FIG. 9 illustrates an exemplary schematic cross-section of a probe card 900 with compliant probes 912 and a layer of secondary probes 908. As illustrated in FIG. 9, the probe card 900 comprises a substrate or PCB layer 902, a layer of secondary probes 908, a space transformer 904, a fine pitch interposer 906, a fine pitch space transformer 910, and a plurality of fine pitch compliant probes 912. In one embodiment, the compliant probes 912 are MEMS probes. In one embodiment, the layer of secondary probes 908 comprises a carbon nano tube interposer providing electrical connections as well as the desired additional compliance for the low-overdrive probes 912. In one embodiment, the layer of secondary probes 908 comprises elastomeric springs 909 that provide electrical connections and the desired additional overdrive compliance.

In one embodiment, the layer of secondary probes 908 is permanently bonded between the substrate 902 and the space transformer 904. In one embodiment, the substrate 902 and the space transformer 904 are permanently bonded 914 with the layer of secondary probes 908 between them. In one embodiment, the permanent bond 914 is an elastic bond with a very low spring constant as compared to a spring constant of the layer of secondary probes 908. By permanently binding the layers sandwiching the layer of secondary probes 908, the probe card 900 is able to share in system overdrive compliance.

Figure 10:
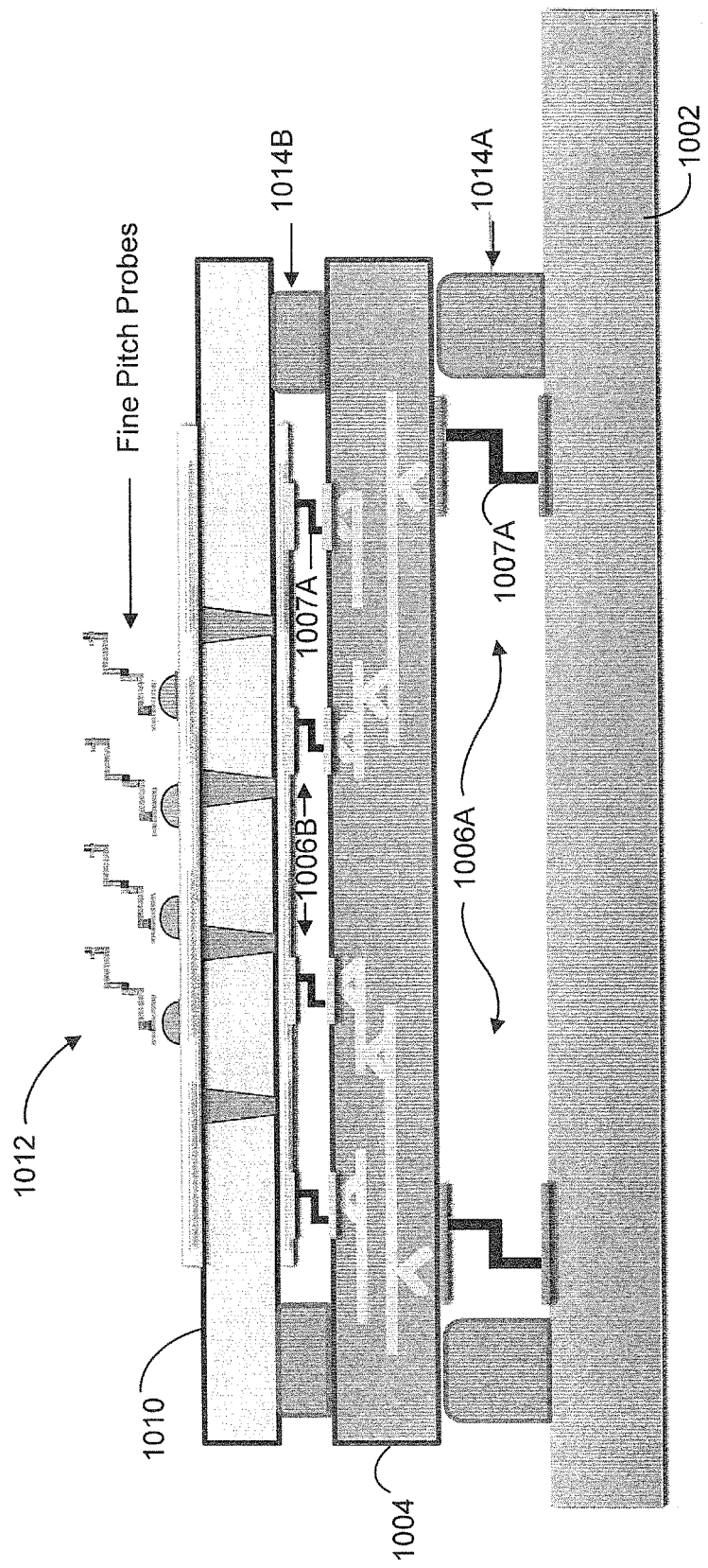
FIG. 10 illustrates an exemplary schematic cross-section of a probe card with low overdrive probes and two layers of additional probes to provide high overdrive in accordance with an embodiment of the present invention.

FIG. 10 illustrates an exemplary schematic cross-section of a probe card 1000 with compliant probes 1012 and a plurality of layers of secondary probes 1006A, 1006B. As illustrated in FIG. 10, the probe card 1000 comprises a substrate or PCB layer 1002, a layer of secondary probes 1006A, a space transformer 1004, a layer of fine pitch secondary probes 1006B, a fine pitch space transformer 1010, and a plurality of fine pitch compliant probes 1012. In one embodiment, the compliant probes 1012 are MEMS probes. In one embodiment, the layer of secondary probes 1006A and the layer of fine pitch secondary probes 1006B comprise carbon nano tube interposers providing electrical connections as well as the desired additional compliance for the low-overdrive probes 912. In one embodiment, the layer of secondary probes 1006A and the layer of fine pitch secondary probes 1006B comprise elastomeric springs 1007A and 1007B, respectively, that provide electrical connections and the desired additional overdrive compliance.

In one embodiment the layer of fine pitch secondary probes 1006B has a greater quantity of elastomeric springs 1007B to allow a finer variation across the surface of the semiconductor wafer under test as compared to the elastomeric springs 1007A of the layer of secondary probes 1006A. In one embodiment the probe card 1000 may comprise approximately 5000 MEMS probes 1012, 500-1000 connections through the layer of fine pitch secondary probes 1006B, and only approximately 400 connections through the larger pitch layer of secondary probes 1006A. Some of the grounds and power lines are ganged together to allow the number of connections to be reduced. In one embodiment, the layer of fine pitch secondary probes 1006B and the layer of secondary probes 1006A, as illustrated in FIG. 10 are similar to the layer of fine pitch secondary probes 808 and the layer of secondary probes 908 of FIGS. 8 and 9, respectively.

In one embodiment, a layer of secondary probes 1006A is permanently bonded between a substrate 1002 and a space transformer 1004. In one embodiment, a layer of fine pitch secondary probes 1006B is permanently bonded between space transformer 1004 and fine pitch space transformer 1010. In one embodiment, the fine pitch space transformer 1010 and the space transformer 1004 are permanently bonded 1014B with the layer of fine pitch secondary probes 1006B between them. In one embodiment, the space transformer 1004 and the substrate 1002 are permanently bonded 1014A with the layer of secondary probes 1006A between them. In one embodiment, the permanent bonds 1014A, 1014B, are elastic bonds having a very low spring constant as compared to a spring constant of the layer of secondary probes 1006A, and the layer of fine pitch secondary probes 1006B, respectively.

Figure 11:
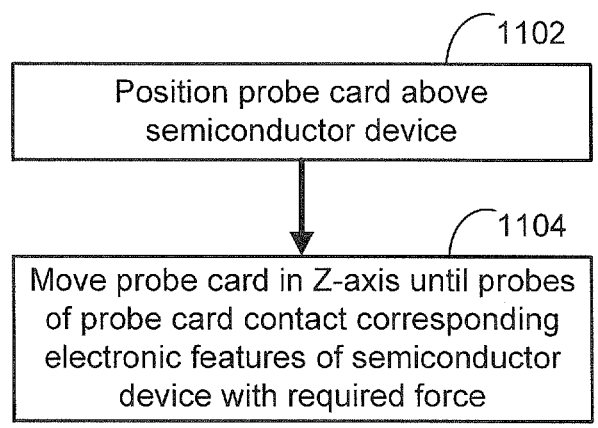
FIG. 11 illustrates a flow diagram, illustrating the steps to a method in accordance with an embodiment of the present invention.

FIG. 11 illustrates the steps to a process for testing a semiconductor wafer by meeting an overdrive compliance requirement by absorbing the overdrive with an overall high overdrive capacity that is divided between complaint probes and one or more layers of secondary probes in a probe card. In step 1102 of FIG. 11, the probe card is positioned above a semiconductor wafer such that probes of the probe card are aligned above corresponding electrical structures of the semiconductor wafer. In one embodiment, the electrical structures may be solder pads or solder bumps. In step 1104 of FIG. 11, the probe card is moved in a Z-axis so that the probes of the probe card approach their corresponding electrical structures. In step 1104 of FIG. 11, the probe card continues moving until the probes of the probe card contact corresponding electrical structures with at least a minimum force to ensure a stable contact between probes and corresponding electrical structures. To ensure the stable contact between probes and electrical structures, an proscribed amount of overdrive is applied to the probes after physical contact with an electrical structure. Therefore, in one embodiment, a probe and probe card system has a sufficient overdrive capability to ensure that all probes are able to make mechanical contact with corresponding electrical structures and then apply further compliance-meeting overdrive to ensure a stable contact.

Figure 12:
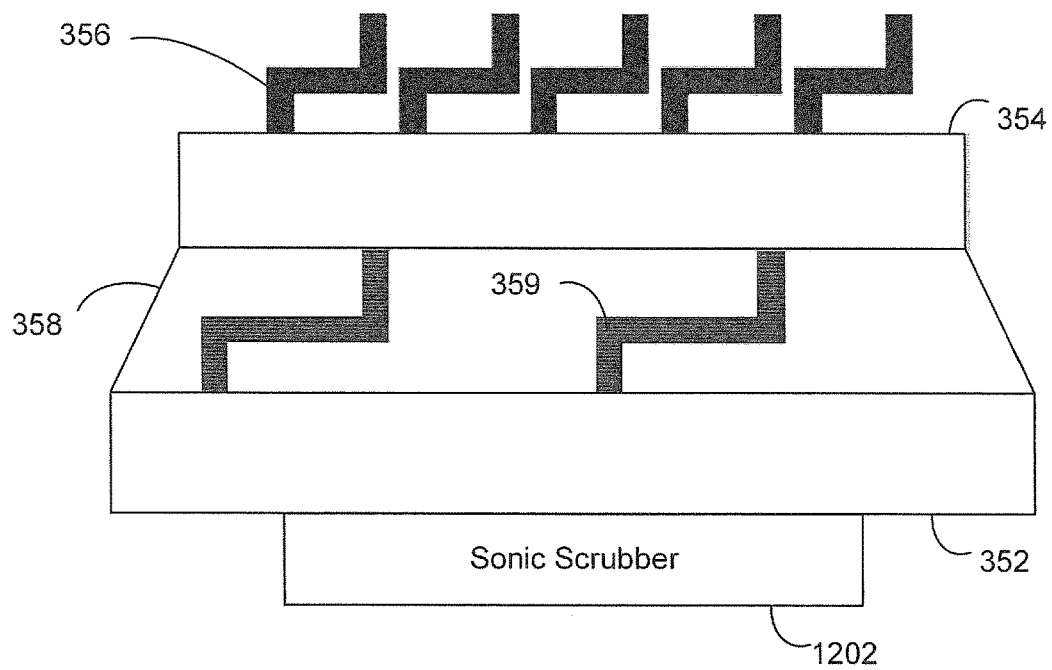
FIG. 12 illustrates an exemplary probe card with compliant probes, a layer of secondary probes, and a sonic scrubbing unit in accordance with an embodiment of the present invention.

FIG. 12 illustrates an exemplary probe card 350 with complaint probes 356, a layer of secondary probes 358, and a sonic scrubbing unit 1202. After the probes 356 have been mated with corresponding electrical structures as discussed herein, an exemplary sonic scrubber 1202 may be activated for a defined period of time (e.g., 10 ms) to induce a scrubbing motion to the probes 356 that facilitates an effective contact between the electrical structures of the semiconductor wafer under test and the probes 356 by breaking any existing oxide covering the electrical structures. In one embodiment, the sonic scrubber 1202 may comprise an ultrasonic or megasonic transducer in various layers of the probe card 350.

Figure 13A:
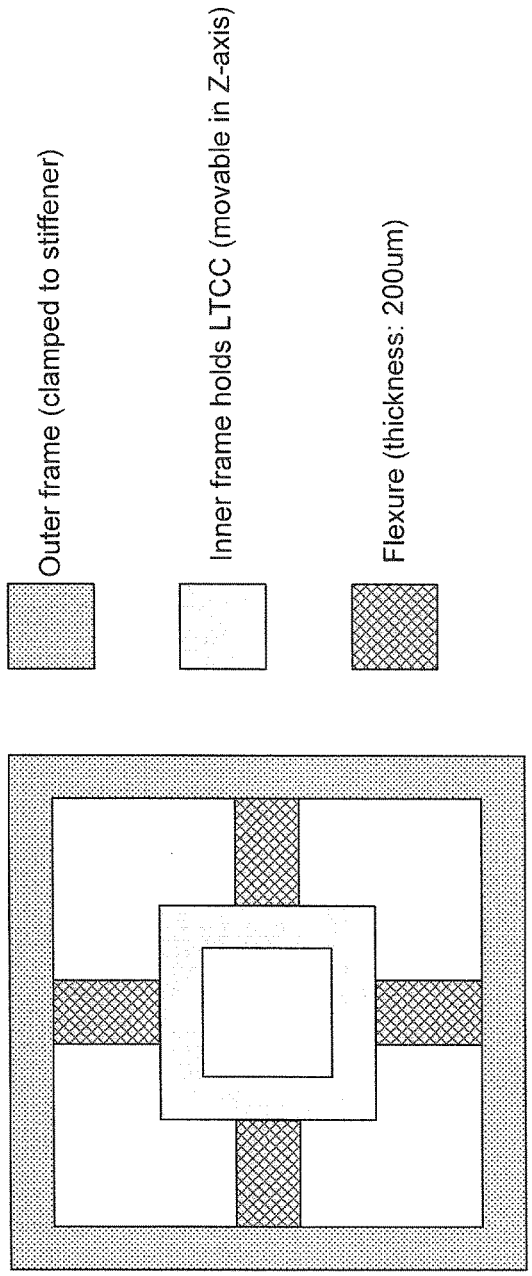
FIGS. 13A and 13B illustrate an exemplary flexure design for a probe card, in accordance with an embodiment of the present invention.
Figure 13B:
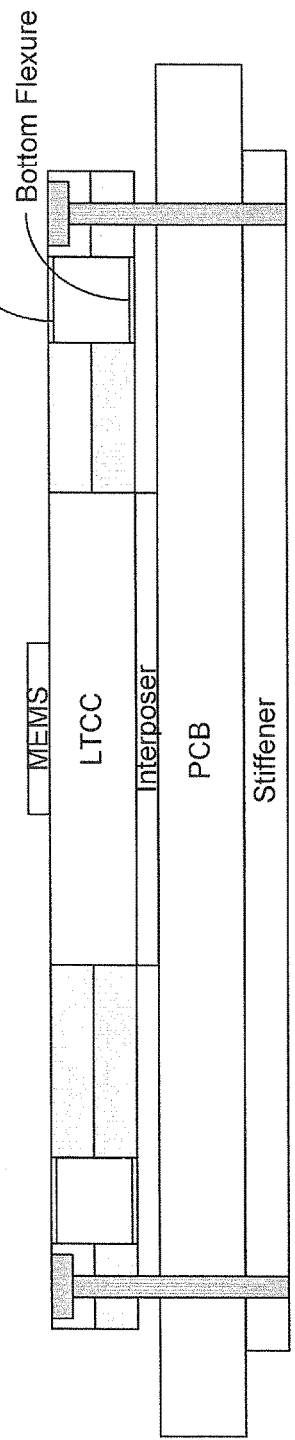

FIGS. 13A and 13B illustrate an exemplary flexure design. In one exemplary embodiment, probe card motion will be strictly in a Z direction without any lateral motion. The exemplary flexure may provide additional force to the interposer force without depending on a spring count or spring constant of the interposer. An exemplary embodiment may use an appropriate interconnect and use the flexure to provide additional controlled overdrive.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for testing a semiconductor device, the method comprising:
   positioning a probe card comprising a plurality of probes above the semiconductor device; and
   moving the probe card in a vertical direction towards the semiconductor device, wherein the moving comprises moving in a vertical direction towards a plurality of electrical structures of the semiconductor device until each probe of the plurality of probes has made mechanical contact with a corresponding electrical structure of the plurality of electrical structures with a prescribed quantity of force,
   wherein each probe of the plurality of probes absorbs a portion of vertical overdrive after contacting its corresponding electrical structure, and wherein the probe card absorbs any remaining vertical overdrive, and wherein vertical overdrive is a continuing vertical movement of the plurality of probes after a first probe of the plurality of probes mechanically contacts a first corresponding electrical structure.

2. The method of claim 1, wherein the first probe exerts a force against the first corresponding electrical structure that is proportional to an amount of vertical overdrive of the first probe after first mechanical contact between the first probe and the first electrical structure.

3. The method of claim 1, wherein the probe card absorbs more vertical overdrive than any probe of the plurality of probes.

4. The method of claim 1 further comprising sonically scrubbing the plurality of probes against their corresponding electrical structures after the plurality of probes makes mechanical contact with their corresponding electrical structures.

5. The method of claim 1, wherein the probe card absorbs a quantity of vertical overdrive with a layer of secondary probes.

6. The method of claim 5, wherein the layer of secondary probes is positioned between a fine pitch space transformer and a standard space transformer.

7. The method of claim 5, wherein the layer of secondary probes is positioned between a standard space transformer and a substrate.

8. The method of claim 1, wherein the plurality of probes comprise micro electro-mechanical system (MEMS) probes.

9. An apparatus for electrically testing a semiconductor device, the apparatus comprising:

a probe card comprising a plurality of probes;

wherein the probe card is operable to move a plurality of probes in a vertical direction towards a plurality of electrical structures of the semiconductor device until each probe of the plurality of probes has made mechanical contact with a corresponding electrical structure of the plurality of corresponding electrical structures with a prescribed quantity of force;

wherein the each probe of the plurality of probes is operable to absorb a portion of vertical overdrive after contacting its corresponding electrical structure; and wherein the probe card is further operable to absorb any remaining vertical overdrive, and wherein vertical overdrive comprises a continuing vertical movement of the plurality of probes after a first probe of the plurality of probes mechanically contacts a first corresponding electrical structure.

10. The apparatus of claim 9, wherein the probe card is further operable to exert a force with a first probe against a first electrical structure that is proportional to an amount of vertical overdrive of the first probe after first mechanical contact between the first probe and the first electrical structure.

11. The apparatus of claim 9, wherein the probe card is further operable to absorb more vertical overdrive than any individual probe of the plurality of probes.

12. The apparatus of claim 9 further comprising a sonic unit operable to sonically scrub the plurality of probes against their corresponding electrical structures after the plurality of probes makes mechanical contact with their corresponding electrical structures.

13. The apparatus of claim 9, wherein the probe card comprises a layer of secondary probes operable to absorb a quantity of vertical overdrive.

14. The apparatus of claim 13, wherein the layer of secondary probes is positioned between a fine pitch space transformer and a standard space transformer.

15. The apparatus of claim 13, wherein the layer of secondary probes is positioned between a standard space transformer and a substrate.

16. The apparatus of claim 9, wherein the plurality of probes comprise micro electro-mechanical system (MEMS) probes.

17. The apparatus of claim 16, wherein a MEMS probe comprises a compliant portion that is operable to absorb a quantity of overdrive.

18. The apparatus of claim 9, wherein the probe card comprises two layers of secondary probes, wherein a first layer of secondary probes is positioned between a fine pitch space transformer and a standard space transformer, and wherein a second layer of secondary probes is positioned between a standard space transformer and a substrate.

19. The apparatus of claim 18, wherein the secondary probes of the first layer are fine pitch probes.

20. A computer-readable medium having computer-readable program code embodied therein for causing a computer system to perform a method for testing a semiconductor device, the method comprising:

positioning a probe card comprising a plurality of probes above the semiconductor device; and moving the probe card in a vertical direction towards the semiconductor device, wherein the moving comprises moving in a vertical direction towards a plurality of electrical structures of the semiconductor device until each probe of the plurality of probes has made mechanical contact with a corresponding electrical structure of the plurality of electrical structures with a prescribed quantity of force, wherein each probe of the plurality of probes absorbs a portion of vertical overdrive after contacting its corresponding electrical structure, and wherein the probe card absorbs any remaining vertical overdrive, and wherein vertical overdrive is a continuing vertical movement of the plurality of probes after a first probe of the plurality of probes mechanically contacts a first corresponding electrical structure.

* * * * *